(12) United States Patent
Tao et al.

(10) Patent No.: US 10,622,465 B2
(45) Date of Patent: Apr. 14, 2020

(54) HETEROJUNCTION BIPOLAR TRANSISTOR (HBT)

(71) Applicant: QUALCOMM Incorporated, San Diego, CA (US)

(72) Inventors: Gengming Tao, San Diego, CA (US); Xia Li, San Diego, CA (US); Bin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/985,423

(22) Filed: May 21, 2018

(65) Prior Publication Data

US 2019/0189787 A1    Jun. 20, 2019

Related U.S. Application Data

(60) Provisional application No. 62/608,249, filed on Dec. 20, 2017.

(51) Int. Cl.

| | |
|---|---|
| *H01L 29/737* | (2006.01) |
| *H01L 29/08* | (2006.01) |
| *H01L 29/423* | (2006.01) |
| *H01L 23/528* | (2006.01) |
| *H01L 23/532* | (2006.01) |
| *H01L 21/768* | (2006.01) |
| *H01L 29/417* | (2006.01) |
| *H01L 23/482* | (2006.01) |
| *H01L 29/66* | (2006.01) |

(Continued)

(52) U.S. Cl.
CPC .... *H01L 29/7371* (2013.01); *H01L 21/76885* (2013.01); *H01L 23/482* (2013.01); *H01L 23/528* (2013.01); *H01L 23/53295* (2013.01); *H01L 29/0653* (2013.01); *H01L 29/0817* (2013.01); *H01L 29/0821* (2013.01); *H01L 29/20* (2013.01); *H01L 29/41708* (2013.01); *H01L 29/42304* (2013.01); *H01L 29/66242* (2013.01); *H01L 21/31058* (2013.01); *H01L 21/31138* (2013.01)

(58) Field of Classification Search
None
See application file for complete search history.

(56) References Cited

U.S. PATENT DOCUMENTS 5,561,306 A * 10/1996 Imamura ............. H01L 29/0817
                                                        257/197
5,729,033 A * 3/1998 Hafizi ................. H01L 29/7371
                                                        257/198

(Continued)

OTHER PUBLICATIONS

International Search Report and Written Opinion—PCT/US2018/061979—ISA/EPO—dated Feb. 19, 2019.

*Primary Examiner* — Chandra Chaudhari
(74) *Attorney, Agent, or Firm* — Seyfarth Shaw LLP

(57) ABSTRACT

A heterojunction bipolar transistor (HBT) may include a base contact and emitter mesas on a collector mesa. The HBT may include emitter contacts on the emitter mesas. The HBT may include a first dielectric layer on the collector mesa, sidewalls of the emitter mesas, and the base contact. The HBT may further include a second dielectric layer on the first dielectric layer and on sidewalls of the emitter contacts. The HBT may further include a secondary conductive layer on the first dielectric layer, the second dielectric layer, and the emitter contacts.

14 Claims, 10 Drawing Sheets

(51) Int. Cl.
  *H01L 29/20* (2006.01)
  *H01L 29/06* (2006.01)
  H01L 21/311 (2006.01)
  H01L 21/3105 (2006.01)

(56) References Cited

U.S. PATENT DOCUMENTS

| | | |
|---|---|---|
| 6,365,477 B1 | 4/2002 | Gaessler et al. |
| 6,894,362 B2 | 5/2005 | Malik |
| 2003/0218184 A1 | 11/2003 | Yanagisawa et al. |
| 2005/0230707 A1 | 10/2005 | Kawasaki et al. |
| 2006/0108665 A1 | 5/2006 | Kurokawa et al. |
| 2007/0012949 A1 | 1/2007 | Kawashima et al. |
| 2014/0312390 A1 | 10/2014 | Tsai et al. |
| 2016/0247745 A1 | 8/2016 | Perkins et al. |
| 2017/0077054 A1 | 3/2017 | Umemoto et al. |
| 2017/0294365 A1 | 10/2017 | Watanabe |
| 2017/0330843 A1 | 11/2017 | Hua et al. |

\* cited by examiner

HETEROJUNCTION BIPOLAR TRANSISTOR (HBT)

CROSS-REFERENCE TO RELATED APPLICATION

The present application claims the benefit of U.S. Provisional Patent Application No. 62/608,249, filed on Dec. 20, 2017, and titled "HETEROJUNCTION BIPOLAR TRANSISTOR (HBT)," the disclosure of which is expressly incorporated by reference herein in its entirety.

TECHNICAL FIELD

Aspects of the present disclosure relate to semiconductor devices and, more particularly, to heterojunction bipolar transistors (HBTs).

BACKGROUND

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. The transistors configured to amplify the communication signal are generally selected to operate at substantially higher frequencies for supporting communication enhancements.

Gallium Arsenide (GaAs) heterojunction bipolar transistors (HBTs) are an important technology for amplifiers, such as power amplifiers (PAs). The integrity of interconnect layers (e.g., metallization one layer (M1), metallization two layer (M2), metallization x layer (Mx), etc.) in GaAs HBTs is important for PA reliability due to high power and high junction temperature of HBTs. Conventional HBTs exhibit cracking and/or forming of seams, which results in undesired conductivity reduction and/or failure of the HBT. Therefore, there is a desire for HBTs that overcome these deficiencies.

SUMMARY

A heterojunction bipolar transistor (HBT) includes a base contact and emitter mesas on a collector mesa. The HBT also includes emitter contacts on the emitter mesas. The HBT further includes a first dielectric layer on the collector mesa, sidewalls of the emitter mesas, and the base contact. The HBT still further includes a second dielectric layer on the first dielectric layer and on sidewalls of the emitter contacts. The HBT has a secondary conductive layer on the first dielectric layer, the second dielectric layer, and the emitter contacts.

A method of fabricating a heterojunction bipolar transistor (HBT) includes depositing a first dielectric layer on a collector mesa, on emitter contacts, and on a base contact of the HBT. The method further includes depositing a second dielectric layer on the first dielectric layer, the second dielectric layer covering the emitter contacts. The method still further includes removing a portion of the second dielectric layer to expose the emitter contacts. The method also includes depositing a conductive layer on the first dielectric layer, the second dielectric layer, and the emitter contacts.

A radio frequency (RF) front end module includes a heterojunction bipolar transistor (HBT) having a base contact and emitter mesas on a collector mesa. The HBT also includes emitter contacts on the emitter mesas. The HBT includes a first dielectric layer on the collector mesa, sidewalls of the emitter mesas, and the base contact. The HBT further includes a second dielectric layer on the first dielectric layer and on sidewalls of the emitter contacts. The HBT still further includes a secondary conductive layer on the first dielectric layer, the second dielectric layer, and the emitter contacts. An antenna is coupled to the HBT.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
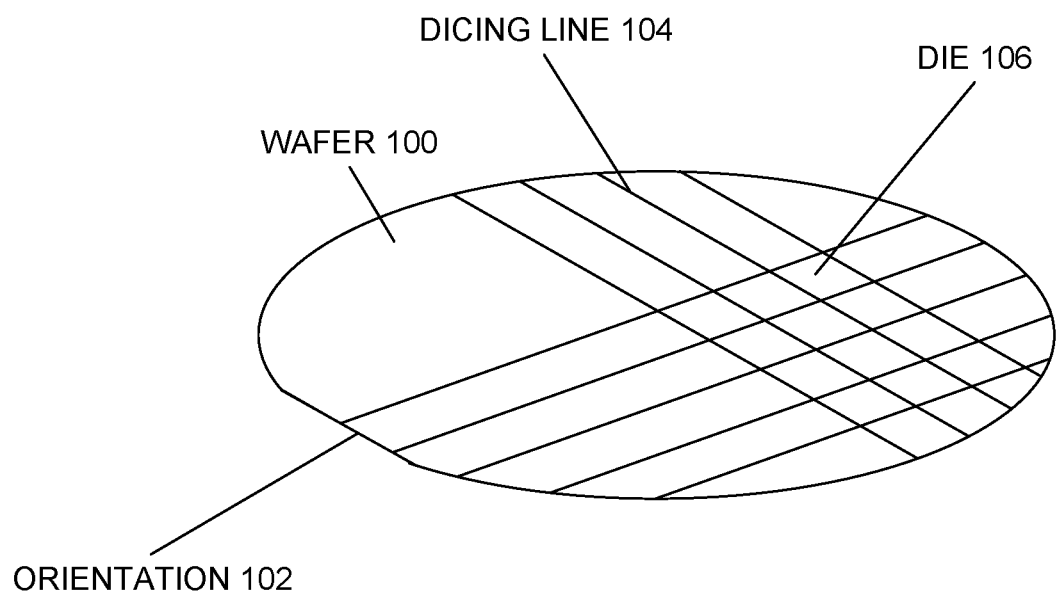
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Fabricating of mobile radio frequency (RF) chips (e.g., mobile RF transceivers) becomes complex at deep sub-micron process nodes due to cost and power consumption considerations. Further design challenges for mobile RF transceivers include analog/RF performance considerations, including mismatch, noise and other performance considerations. The design complexity of these mobile RF transceivers is further complicated by added circuit functions for supporting communication enhancements.

Bipolar transistors, which are also referred to as bipolar junction transistors (BJTs), are a type of transistor that uses both hole and electron charge carriers. Bipolar transistors are fabricated in integrated circuits and are also used as individual components. Bipolar transistors are designed to amplify current. This basic function of bipolar transistors makes them a logical choice for implementing amplifiers and switches. As a result, bipolar transistors are widely used in electronic equipment, such as cellular phones, audio amplifiers, and radio transmitters.

A heterojunction bipolar transistor (HBT) is a type of bipolar transistor that uses different semiconductor materials for emitter and base regions of the device, which creates a heterojunction. A heterojunction bipolar transistor may use a III-V compound semiconductor material, a II-VI compound semiconductor material, or other like compound semiconductor material. III-V (and II-VI) compound semiconductor materials generally exhibit high carrier mobility and direct energy gaps, which makes these compound semiconductor materials useful for optoelectronics. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs specifying high power efficiency including RF power amplifiers in mobile RF transceivers.

By contrast, a relatively small number of silicon based complementary metal oxide semiconductor (CMOS) transistors are used to manufacture RF power amplifiers because the various analog inductors, capacitors, and resistors that are fundamental to RF applications are generally separate from the RF digital circuits. Highly complex and highly integrated baseband and transceiver RF integrated circuits, however, involve advanced, reduced gate-length CMOS processes for integrating functions in very small die. For example, within an RF front end module, CMOS processes are used to manufacture the switch as well as the digital controls. Conversely, III-V compound semiconductor heterojunction bipolar transistors are used for the power amplifier.

Gallium Arsenide (GaAs) heterojunction bipolar transistors (HBTs) are an important technology for power amplifiers (PAs). The integrity of metallization layer processes (e.g., metallization one layer (M1), metallization two layer (M2), metallization x layer (Mx), etc.) in GaAs HBTs is important for PA reliability due to a high power and a high junction temperature of HBTs. Conventional HBTs exhibit cracking and/or forming of seams, which result in undesired conductivity reduction and/or failure of the HBT.

Aspects of the present disclosure provide an HBT that overcomes these deficiencies by including a base contact and emitter mesas on a collector mesa. The HBT may further include emitter contacts on the emitter mesas. The HBT may also include a first dielectric layer on the collector mesa, sidewalls of the emitter mesas, and the base contact. The base contact and the emitter contacts may be constructed in a first conductive layer (e.g., a metallization one layer (M1)). A second dielectric layer may be deposited on the first dielectric layer. A second conductive layer (e.g., a metallization two layer (M2)) may be deposited on the first dielectric layer, the second dielectric layer, and the emitter contacts.

It will be understood that the term "layer" includes film and is not to be construed as indicating a vertical or horizontal thickness unless otherwise stated. As described herein, the term "substrate" may refer to a substrate of a diced wafer or may refer to the substrate of a wafer that is not diced. Similarly, the terms wafer and die may be used interchangeably.

FIG. 1 illustrates a perspective view of a semiconductor wafer including the disclosed heterojunction bipolar transistors (HBTs). A wafer 100 may be a semiconductor wafer, or may be a substrate material with one or more layers of semiconductor material on a surface of the wafer 100. The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of packaging that provide access to the die 106. The die 106 may also be directly accessed through wire bonding, probes, or other connections without mounting the die 106 into a separate package.

Figure 2:
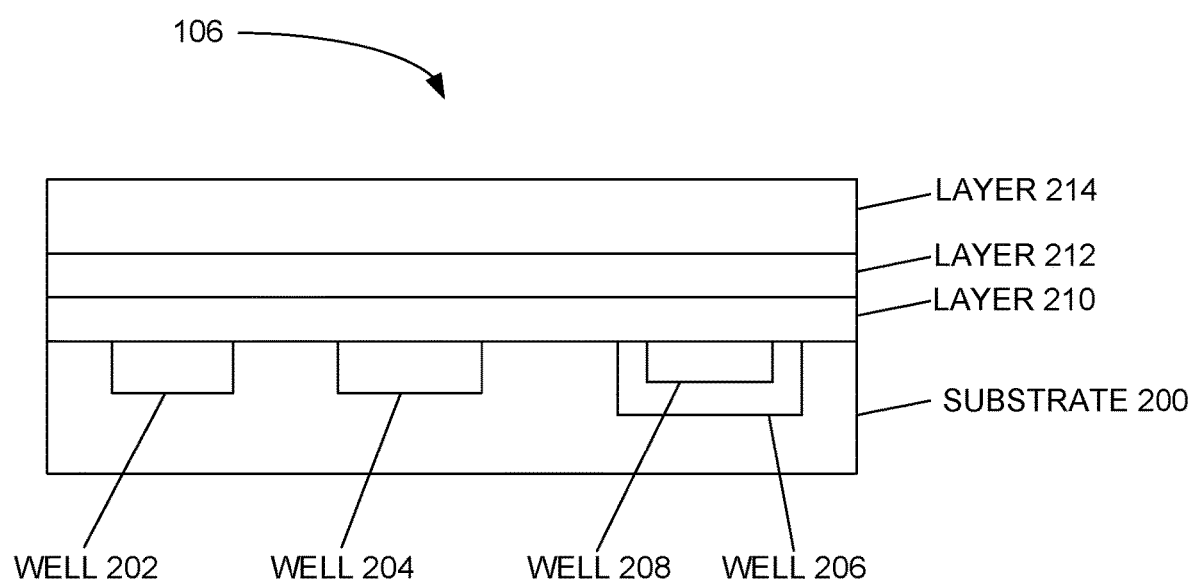
FIG. 2 illustrates a cross-sectional view of a die.

FIG. 2 illustrates a cross-sectional view of a die 106 including the disclosed heterojunction bipolar transistors (HBTs). In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200. Alternatively, the substrate may be a semi-insulating substrate, including compound semiconductor materials.

Within the substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT), a heterojunction bipolar transistor (HBT), or other like compound semiconductor transistor. The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure. Aspects of the present disclosure may be directed to reducing heat in heterojunction bipolar transistors or other like compound semiconductor transistors.

A heterojunction bipolar transistor (HBT) is a type of bipolar transistor that uses different semiconductor materials for emitter and base regions of the device, which creates a heterojunction. A heterojunction bipolar transistor may use a III-V compound semiconductor material, a II-VI compound semiconductor material, or other like compound semiconductor material. III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs including RF power amplifiers in mobile RF transceivers, for example, as shown in FIG. 3.

Figure 3:
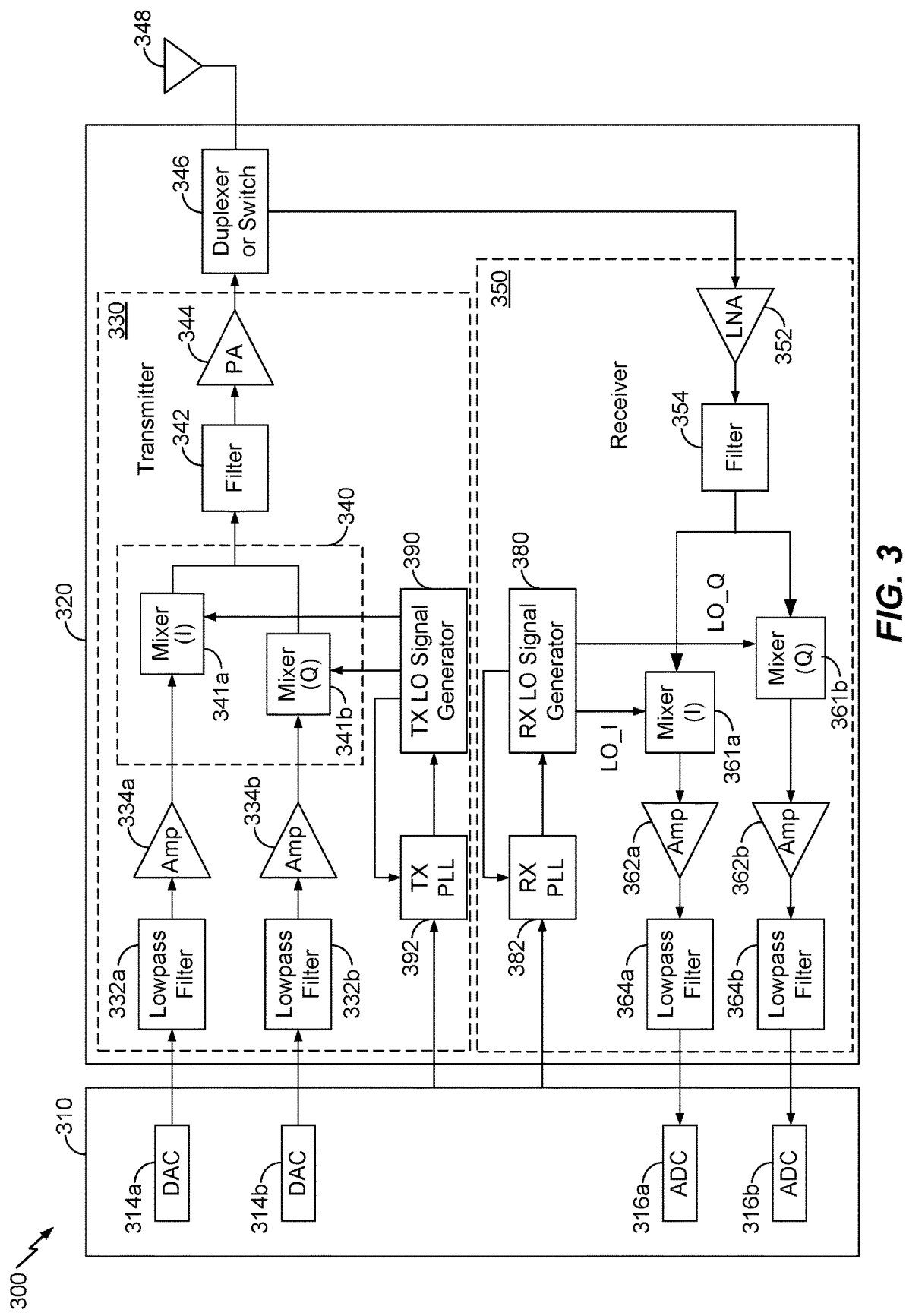
FIG. 3 shows a block diagram of an exemplary wireless device.

FIG. 3 shows a block diagram of an exemplary design of a wireless device 300, which may include the disclosed heterojunction bipolar transistors (HBTs). FIG. 3 shows an example of a transceiver 320, which may be a wireless transceiver (WTR). In general, the conditioning of the signals in a transmitter 330 and a receiver 350 may be performed by one or more stages of amplifier(s), filter(s), upconverters, downconverters, and the like. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, the wireless device 300 generally includes the transceiver 320 and a data processor 310. The data processor 310 may include a memory (not shown) to store data and program codes, and may generally include analog and digital processing elements. The transceiver 320 may include the transmitter 330 and receiver 350 that support bi-directional communication. In general, the wireless device 300 may include any number of transmitters and/or receivers for any number of communication systems and frequency bands. All or a portion of the transceiver 320 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 3, the transmitter 330 and the receiver 350 are implemented with the direct-conversion architecture.

In a transmit path, the data processor 310 processes data to be transmitted. The data processor 310 also provides in-phase (I) and quadrature (Q) analog output signals to the transmitter 330 in the transmit path. In an exemplary aspect, the data processor 310 includes digital-to-analog-converters (DACs) 314a and 314b for converting digital signals generated by the data processor 310 into the in-phase (I) and quadrature (Q) analog output signals (e.g., I and Q output currents) for further processing.

Within the transmitter 330, low pass filters 332a and 332b filter the in-phase (I) and quadrature (Q) analog transmit signals, respectively, to remove undesired images caused by the prior digital-to-analog conversion. Amplifiers (Amp) 334a and 334b amplify the signals from low pass filters 332a and 332b, respectively, and provide in-phase (I) and quadrature (Q) baseband signals. Upconversion mixers 341a and 341b of an upconverter 340 upconverts the in-phase (I) and quadrature (Q) baseband signals with in-phase (I) and quadrature (Q) transmit (TX) local oscillator (LO) signals from a TX LO signal generator 390 to provide an upconverted signal. A filter 342 filters the upconverted signal to remove undesired images caused by the frequency upconversion as well as noise in a receive frequency band. A power amplifier (PA) 344 amplifies the signal from the filter 342 to obtain the desired output power level and provides a transmit radio frequency signal. The transmit radio frequency signal is routed through a duplexer/switch 346 and transmitted via an antenna 348.

In a receive path, the antenna 348 receives communication signals and provides a received radio frequency (RF) signal, which is routed through the duplexer/switch 346 and provided to a low noise amplifier (LNA) 352. The duplexer/switch 346 is designed to operate with a specific receive (RX) to transmit (TX) (RX-to-TX) duplexer frequency separation, such that RX signals are isolated from TX signals. The received RF signal is amplified by the LNA 352 and filtered by a filter 354 to obtain a desired RF input signal. Downconversion mixers 361a and 361b mix the output of the filter 354 with in-phase (I) and quadrature (Q) receive (RX) LO signals (i.e., LO_I and LO_Q) from an RX LO signal generator 380 to generate in-phase (I) and quadrature (Q) baseband signals. The in-phase (I) and quadrature (Q) baseband signals are amplified by amplifiers 362a and 362b and further filtered by low pass filters 364a and 364b to obtain in-phase (I) and quadrature (Q) analog input signals, which are provided to the data processor 310. In the exemplary configuration shown, the data processor 310 includes analog-to-digital-converters (ADCs) 316a and 316b for converting the analog input signals into digital signals for further processing by the data processor 310.

In FIG. 3, the transmit local oscillator (TX LO) signal generator (e.g., TX LO signal generator 390) generates the in-phase (I) and quadrature (Q) TX LO signals used for frequency upconversion, while the receive local oscillator (RX LO) signal generator (e.g., RX LO signal generator 380) generates the in-phase (I) and quadrature (Q) RX LO signals used for frequency downconversion. Each LO signal is a periodic signal with a particular fundamental frequency. A phase locked loop (PLL) 392 receives timing information from the data processor 310 and generates a control signal used to adjust the frequency and/or phase of the TX LO signals from the TX LO signal generator 390. Similarly, a PLL 382 receives timing information from the data processor 310 and generates a control signal used to adjust the frequency and/or phase of the RX LO signals from the RX LO signal generator 380.

A power amplifier 344 may include one or more stages having, for example, driver stages, power amplifier stages, or other components, that can be configured to amplify a communication signal on one or more frequencies, in one or more frequency bands, and at one or more power levels. The transistors configured to amplify the communication signal, however, are generally selected to operate at substantially higher frequencies, complicating thermal power specifications. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs specifying high power efficiency including RF power amplifiers in mobile RF transceivers.

Figure 4A:
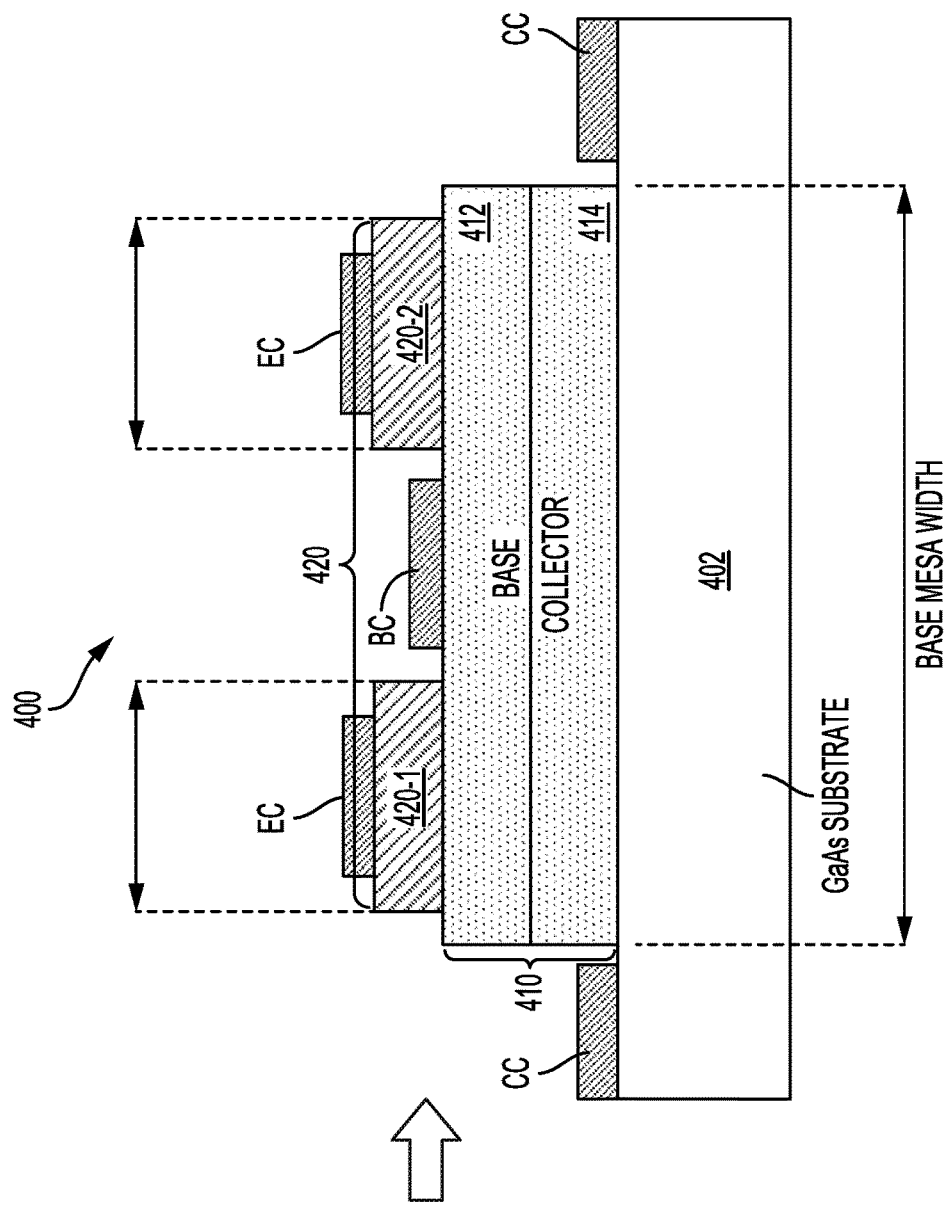
FIGS. 4A and 4B illustrate a top view and a cross-sectional view of a conventional heterojunction bipolar transistor (HBT).
Figure 4B:
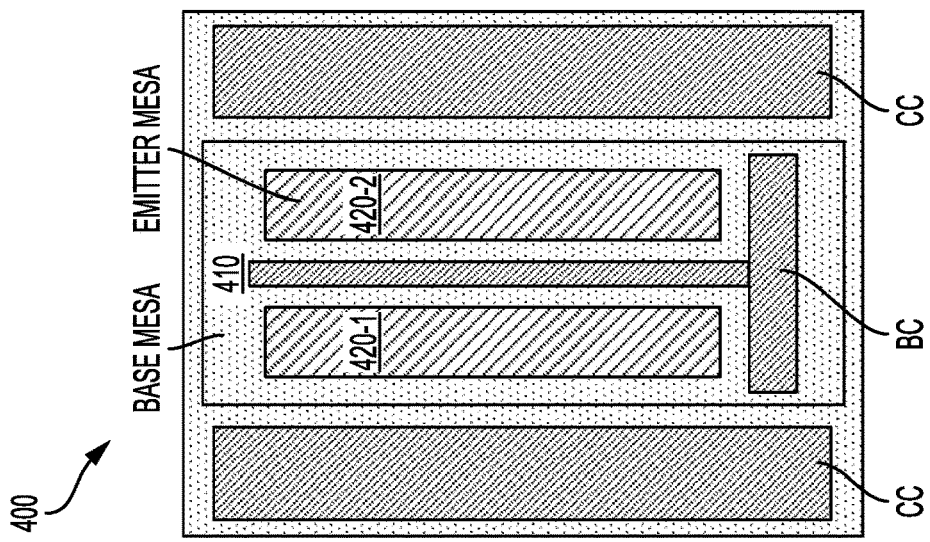

FIGS. 4A and 4B illustrate a cross-section view and a top view of a heterojunction bipolar transistor.

FIG. 4A shows a heterojunction bipolar transistor (HBT) device (e.g., HBT device 400). The HBT device 400 includes a dual emitter structure 420 supported by a base mesa 410. The dual emitter structure 420 includes a first emitter mesa 420-1 having an emitter contact EC. In addition, the dual emitter structure 420 includes a second emitter mesa 420-2, also having an emitter contact EC. A base contact BC is between the first emitter mesa 420-1 and the second emitter mesa 420-2.

As shown in FIG. 4B, the base contact BC can be T-shaped, including a portion along and between the first emitter mesa 420-1 and the second emitter mesa 420-2, between the collector contacts CC. The T-shaped base contact BC also includes a second portion that runs along a length of the base mesa 410, between the first emitter mesa 420-1 and the second emitter mesa 420-2. Although described as T-shaped, it should be recognized that the base contact BC may be arranged in other shapes according to aspects of the present disclosure.

Referring again to FIG. 4A, the base mesa 410 may include a base 412 supported by a collector 414. The base mesa 410 is supported by a compound semiconductor substrate 402 (e.g., gallium arsenide (GaAs)). Collector contacts CC of the collector 414 may be on the compound semiconductor substrate 402. Alternatively, the collector contacts CC may be on a sub-collector (not shown) supported by the compound semiconductor substrate 402. A width of the base mesa and a width of the first emitter mesa 420-1 and the second emitter mesa 420-2 are also shown.

Figure 5:
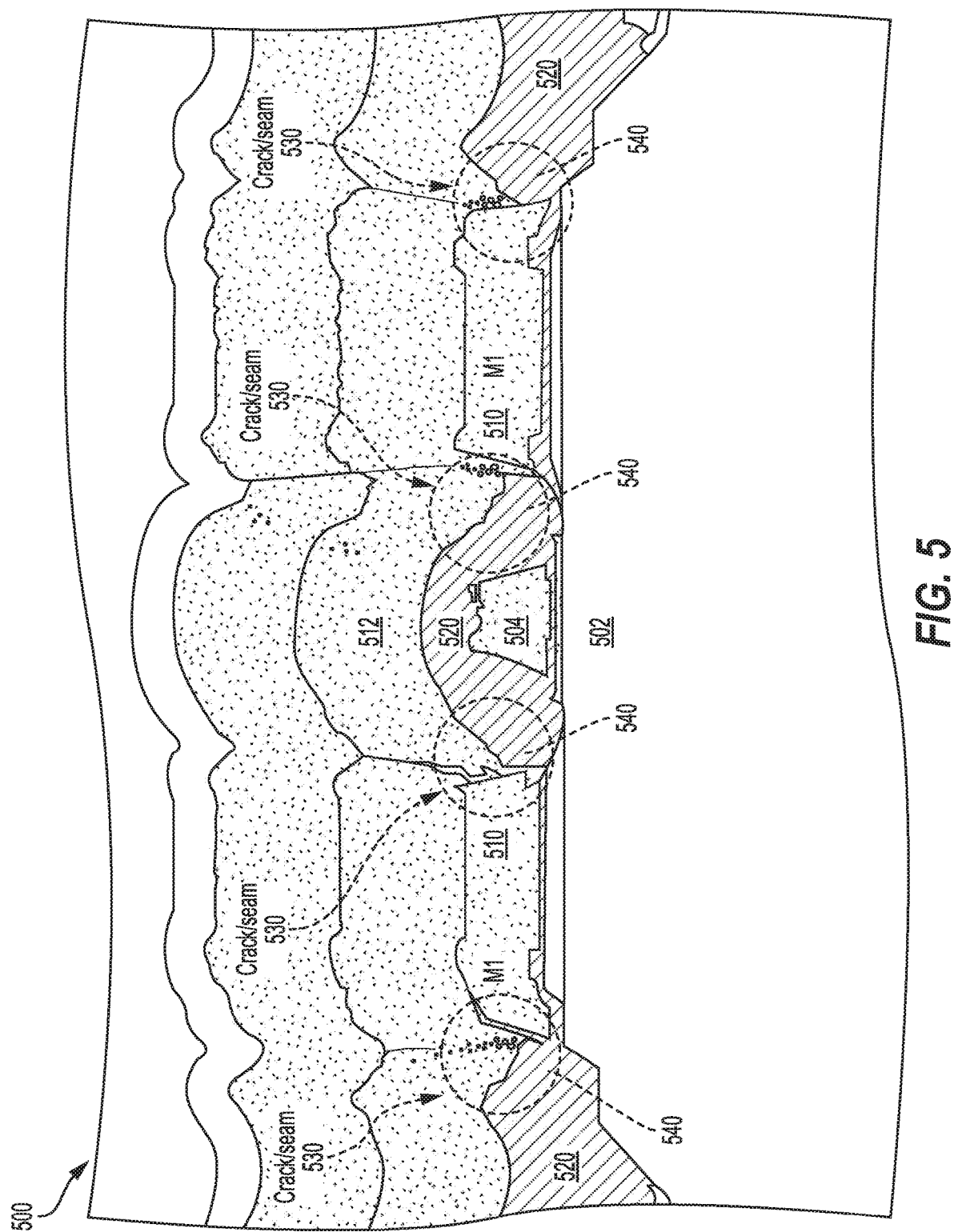
FIG. 5 illustrates a cross-sectional view of a conventional heterojunction bipolar transistor (HBT) having cracks.

FIG. 5 illustrates a cross-sectional view of a conventional heterojunction bipolar transistor (HBT) 500 having cracks 530. The HBT 500 includes a substrate 502 supporting a dielectric layer 520, an M1 metallization layer 510, and a base contact 504. An M2 metallization layer 512 may be supported by the M1 metallization layer 510. The dielectric layer 520 also covers the base contact 504.

As illustrated, the HBT 500 includes cracks 530 and trenches 540. The trenches 540 are formed during a conventional metal evaporation process because the dielectric layer 520 is not well planarized. As a result, stress along the trenches 540 cause the cracks 530 to form between the M1 metallization layer 510 and the M2 metallization layer 512. The cracks 530 are undesirable because they reduce conductivity and increase the likelihood of failure due to high power and high temperature operations.

Gallium Arsenide (GaAs) heterojunction bipolar transistors (HBTs) are an important technology for power amplifiers (PAs). The integrity of metallization layer processes (e.g., metallization one layer (M1), metallization two layer (M2), metallization x layer (Mx), etc.) in GaAs HBTs is important for PA reliability due to a high power and a high junction temperature of HBTs. Unfortunately, as discussed above, conventional HBTs exhibit cracking and/or forming of seams, which result in an undesired conductivity reduction and/or failure of the HBTs.

Aspects of the present disclosure provide an HBT that overcomes these deficiencies by including a base contact and emitter mesas on a collector mesa. The HBT may further include emitter contacts on the emitter mesas. The base contact, collector contacts, and emitter contacts are part of a first metallization layer (M1). The HBT may also include a first dielectric layer on the collector mesa, sidewalls of the emitter mesas, and the base contact. A second dielectric layer is on the first dielectric layer. A second metallization layer (M2) is on the first dielectric layer, the second dielectric layer, and the emitter contacts.

Figure 6:
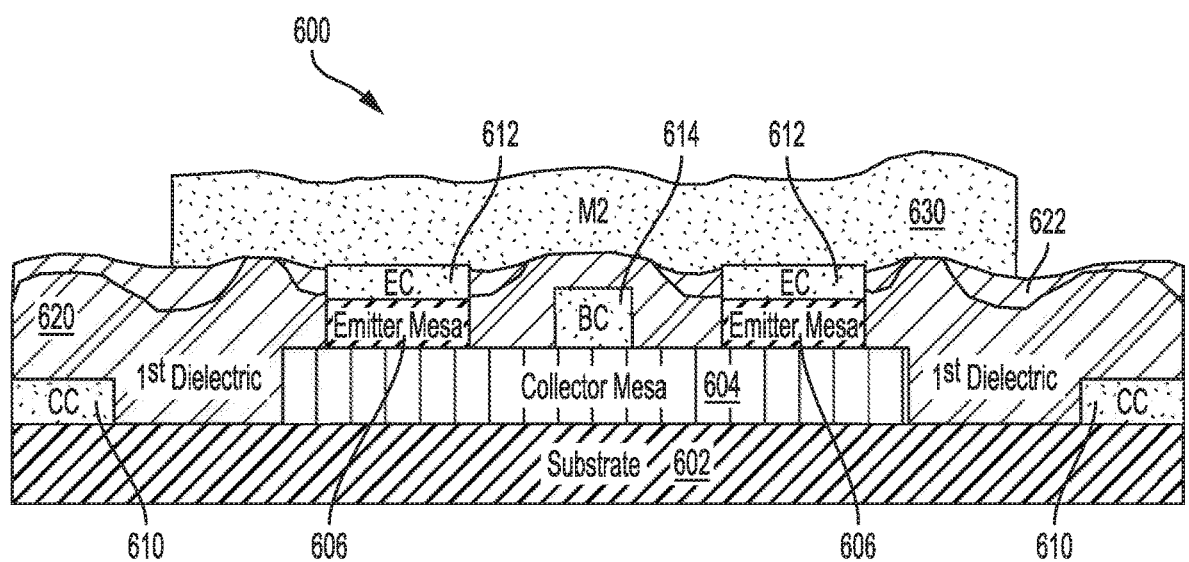
FIG. 6 illustrates a heterojunction bipolar transistor (HBT), according to aspects of the present disclosure.

FIG. 6 illustrates a heterojunction bipolar transistor (HBT) 600, according to aspects of the present disclosure. The HBT 600 may include a substrate 602 supporting a collector mesa 604, collector contacts 610, and a first dielectric layer 620. The substrate 602 and the collector mesa 604 may be gallium arsenide (GaAs).

The collector mesa 604 may support both emitter mesas 606 and a base contact 614. The first dielectric layer 620 may support a second dielectric layer 622. Emitter contacts 612 may be supported by the emitter mesas 606. An M2 metallization layer 630 (e.g., a secondary conductive layer) may be coupled to the emitter contacts 612, and may be supported by the emitter contacts 612, the first dielectric layer 620, and the second dielectric layer 622. The collector contacts 610, the emitter contacts 612, and the base contact 614 may be part of an M1 metallization layer (e.g., a primary conductive layer).

According to aspects of the present disclosure, the first dielectric layer 620 may directly contact the collector contacts 610, the base contact 614, the collector mesa 604, and sidewalls of the emitter mesas 606. The second dielectric layer 622 may directly contact the first dielectric layer 620 and sidewalls of the emitter contacts 612. The M2 metallization layer 630 may directly contact the first dielectric layer 620, the second dielectric layer 622, and a top surface of the emitter contacts 612. The first dielectric layer 620 may cover the base contact 614.

The second dielectric layer 622 covers the first dielectric layer 620 and is planarized such that the M2 metallization layer 630 is uniformly deposited over the HBT 600. As such, no trenches or cracks form in the HBT 600.

Figure 7A:
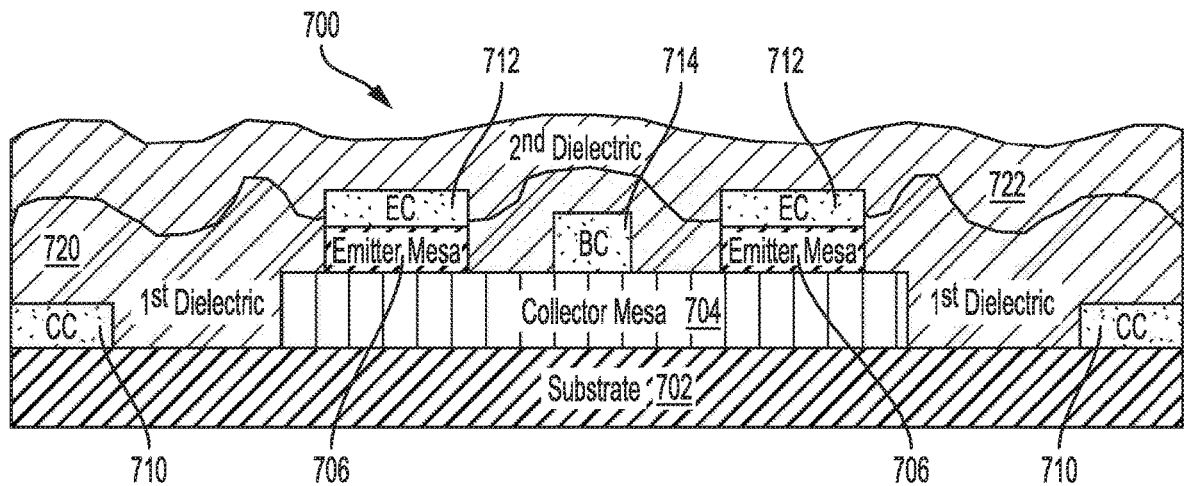
FIGS. 7A-7C illustrate diagrams for forming a heterojunction bipolar transistor (HBT), according to aspects of the present disclosure.
Figure 7B:
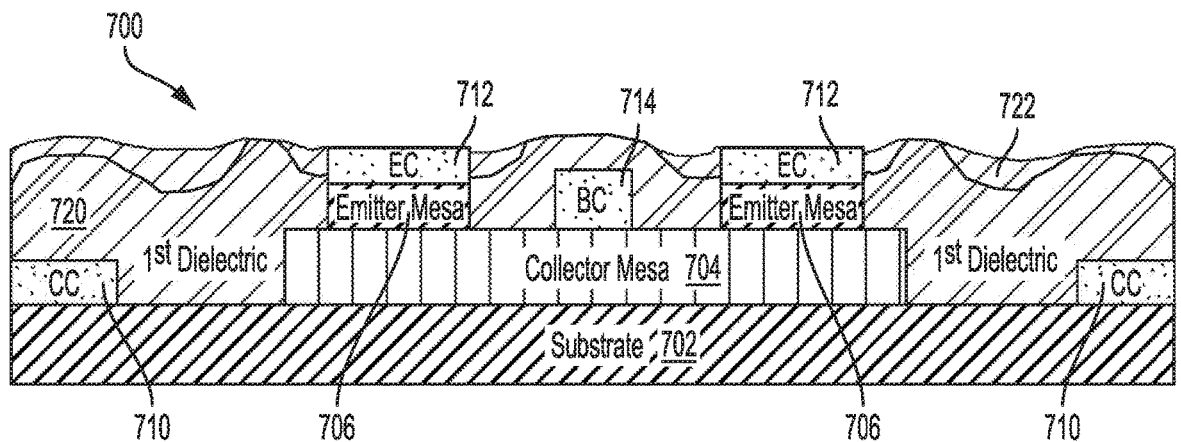
Figure 7C:
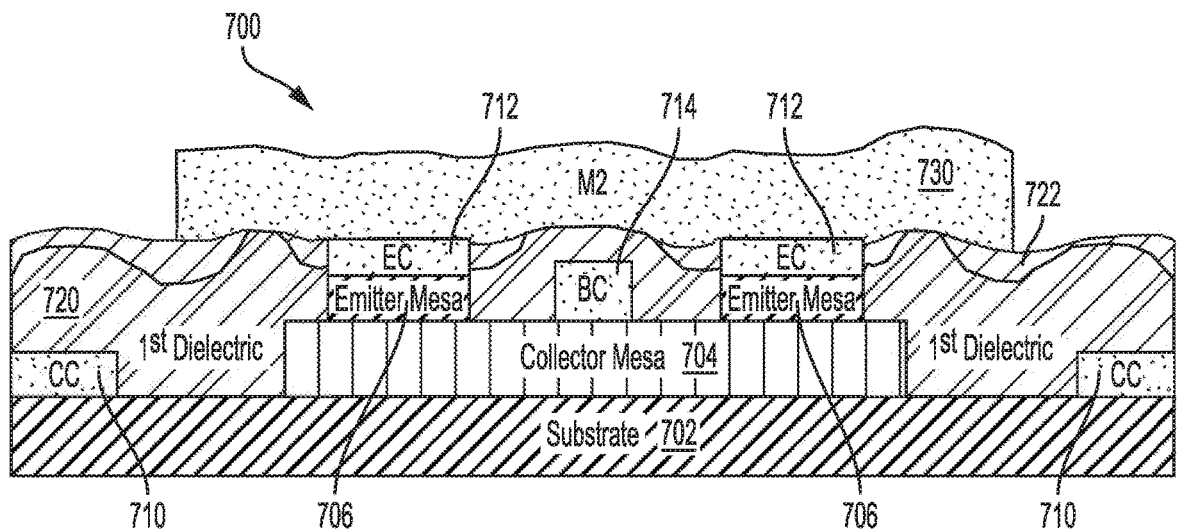

FIGS. 7A-7C illustrate diagrams showing forming of a heterojunction bipolar transistor (HBT) 700, according to aspects of the present disclosure. As shown in FIG. 7A, a substrate 702 supports a collector mesa 704 and collector contacts (CC) 710. For example, the substrate 702 may be Gallium Arsenide (GaAs). The collector mesa 704 may support a base contact (BC) 714, emitter mesas 706, and emitter contacts (EC) 712.

A first dielectric layer 720 (e.g., polyimide) may be deposited on the substrate 702, the collector contacts 710, the collector mesa 704, the base contact 714, and the emitter mesas 706. For example, the first dielectric layer 720 may be defined through lithography and etching. In addition, a second dielectric layer 722 (e.g., polyimide) may be deposited on the first dielectric layer 720 and the emitter contacts 712. In this example, the second dielectric layer 722 may be polyimide, bisbenzocyclotene (BCB), and/or polybenzoxazole (PBO). According to aspects of the present disclosure, the first dielectric layer 720 (e.g., first polyimide layer) and the second dielectric layer 722 (e.g., second polyimide layer) may be composed of the same or different materials.

As shown in FIG. 7B, a blanket etch back may be performed on the second dielectric layer 722 (e.g., polyimide/BCB/PBO) to expose the emitter contacts 712 as well as portions of the first dielectric layer 720 to provide a substantially flat surface area. In this example, a plasma etch or chemical-mechanical planarization (CMP) process may be used.

According to aspects of the present disclosure, substantial portions of the second dielectric layer 722 as well as some of the first dielectric layer 720 may be etched away to expose top portions of the emitter contacts 712. A surface of the remaining portions of the second dielectric layer 722 and the first dielectric layer 720 may be substantially flat in relation to the exposed top portions of the emitter contacts 712.

According to aspects of the present disclosure, processing may optimize a flatness of the second dielectric layer 722. For example, material viscosity, spin speed, curing temperature, and the like may improve the flatness of the second dielectric layer 722.

As shown in FIG. 7C, an M2 metallization layer 730 may then be deposited with a flat profile on the emitter contacts 712, the first dielectric layer 720, and the second dielectric layer 722 to complete formation of the HBT 700. For example, the M2 metallization layer 730 may be deposited on an etched surface of the second dielectric layer 722, the first dielectric layer 720, and the exposed top portions of the emitter contacts 712. Because the blanket etch process flattens the profile of the second dielectric layer 722 and the first dielectric layer 720 to substantially match a flat profile of the exposed top portions of the emitter contacts 712, the M2 metallization layer 730 is deposited with a flat profile as well. According to aspects of the present disclosure, having a substantially flat profile is desirable for preventing undesirable cracking during HBT 700 operation.

Figure 8:
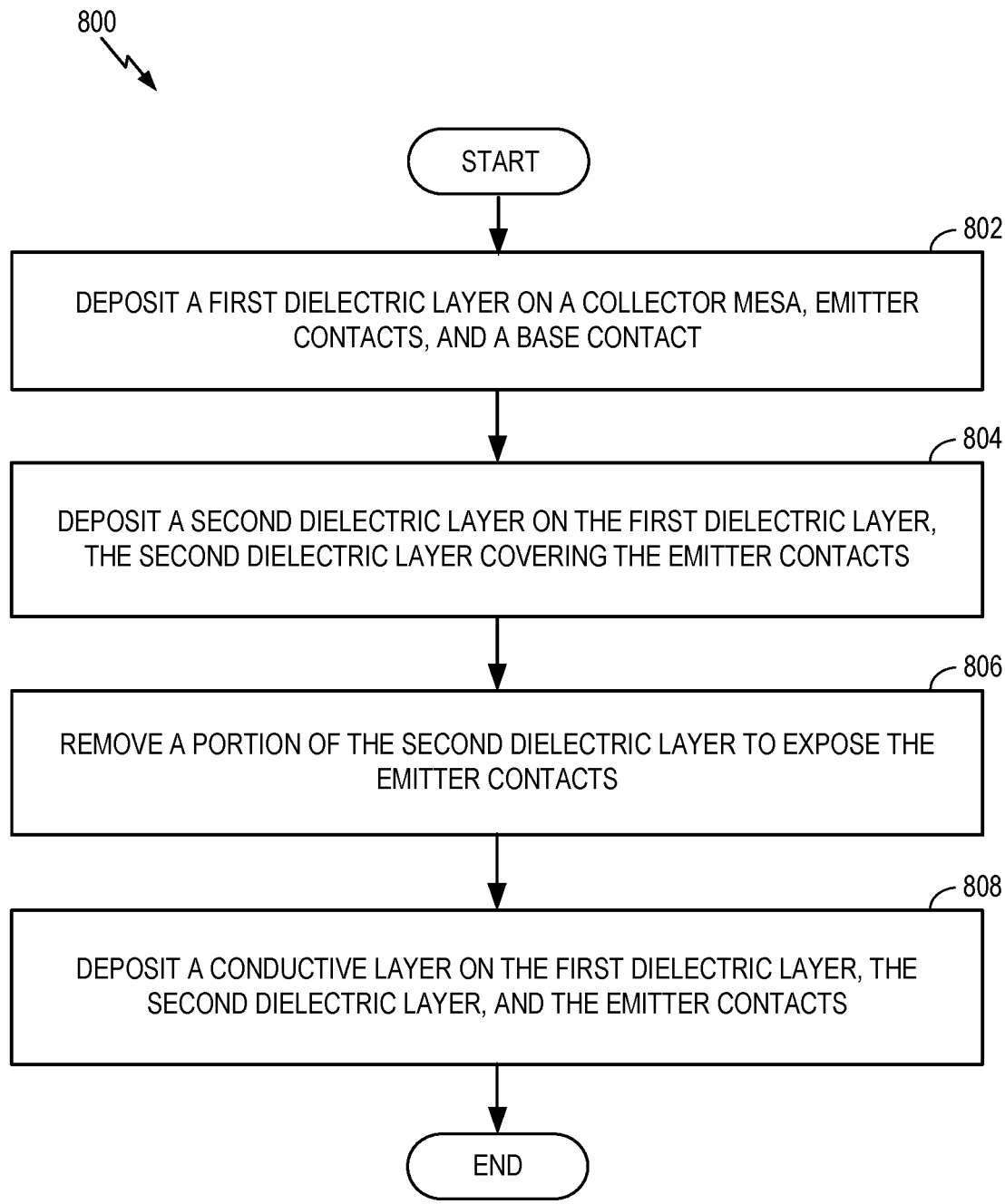
FIG. 8 illustrates a method for fabricating a heterojunction bipolar transistor (HBT), according to aspects of the present disclosure.

FIG. 8 is a process flow diagram 800 illustrating a method of fabricating a heterojunction bipolar transistor (HBT), according to aspects of the present disclosure. At block 802, a first dielectric layer is deposited on a collector mesa, emitter contacts, and a base contact of the HBT. For example, as shown in FIG. 7A, the first dielectric layer 720 (e.g., polyimide) is deposited on the collector mesa 704, base contact 714, and emitter mesas 706. The emitter contacts 712 may be exposed through a photolithography process.

At block 804, a second dielectric layer is deposited on the first dielectric layer, the second dielectric layer covering the emitter contacts. For example, as shown in FIG. 7A, the second dielectric layer 722 (e.g., polyimide) is deposited on the first dielectric layer 720.

At block 806, a portion of the second dielectric layer is removed to expose the emitter contacts. For example, as shown in FIG. 7B, the second dielectric layer 722 is etched to form a substantially flat surface.

At block 808, a conductive (e.g., metal) layer is deposited on the first dielectric layer, the second dielectric layer, and the emitter contacts. For example, as shown in FIG. 7C, the M2 metallization layer 730 is deposited on the substantially flat surface shown in FIG. 7B to complete formation of the HBT 700.

Figure 9:
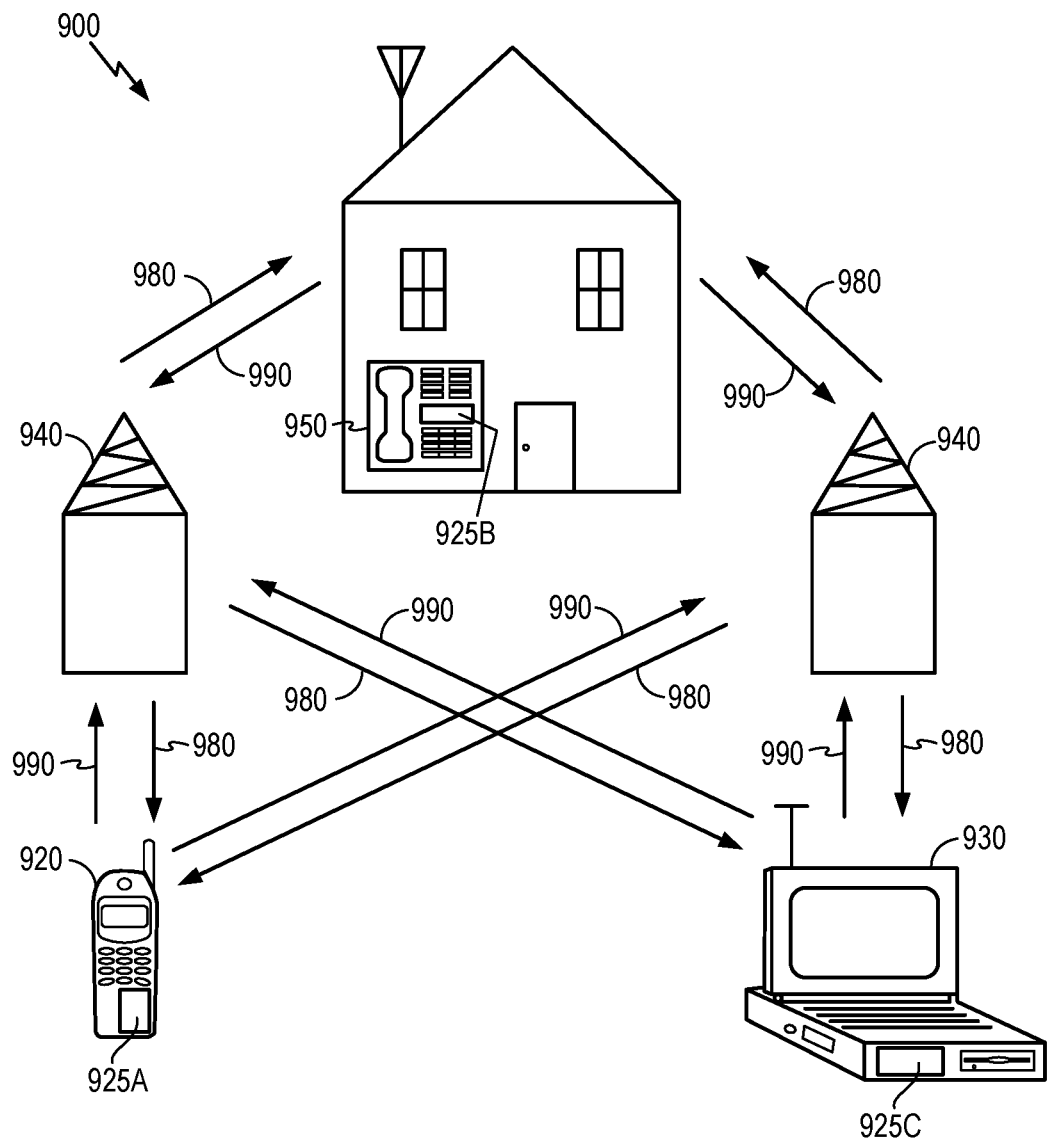
FIG. 9 is a block diagram showing an exemplary wireless communication system in which an aspect of the present disclosure may be advantageously employed.

FIG. 9 is a block diagram showing an exemplary wireless communication system 900 in which an aspect of the present disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C, and 925B that include the disclosed HBT device. It will be recognized that other devices may also include the disclosed HBT device, such as the base stations, switching devices, and network equipment. FIG. 9 shows forward link signals 980 from the base stations 940 to the remote units 920, 930, and 950 and reverse link signals 990 from the remote units 920, 930, and 950 to the base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communication systems (PCS) unit, a portable data unit such as a personal data assistant, a GPS enabled devices, a navigation device, a set top box, a music player, a video player, an entertainment unit, a fixed location data unit such as meter reading equipment, or other devices that store or retrieve data or computer instructions, or combinations thereof. Although FIG. 9 illustrates remote units according to the aspects of the present disclosure, the present disclosure is not limited to these exemplary illustrated units. Aspects of the present disclosure may be suitably employed in many devices, which include the disclosed HBT device.

Figure 10:
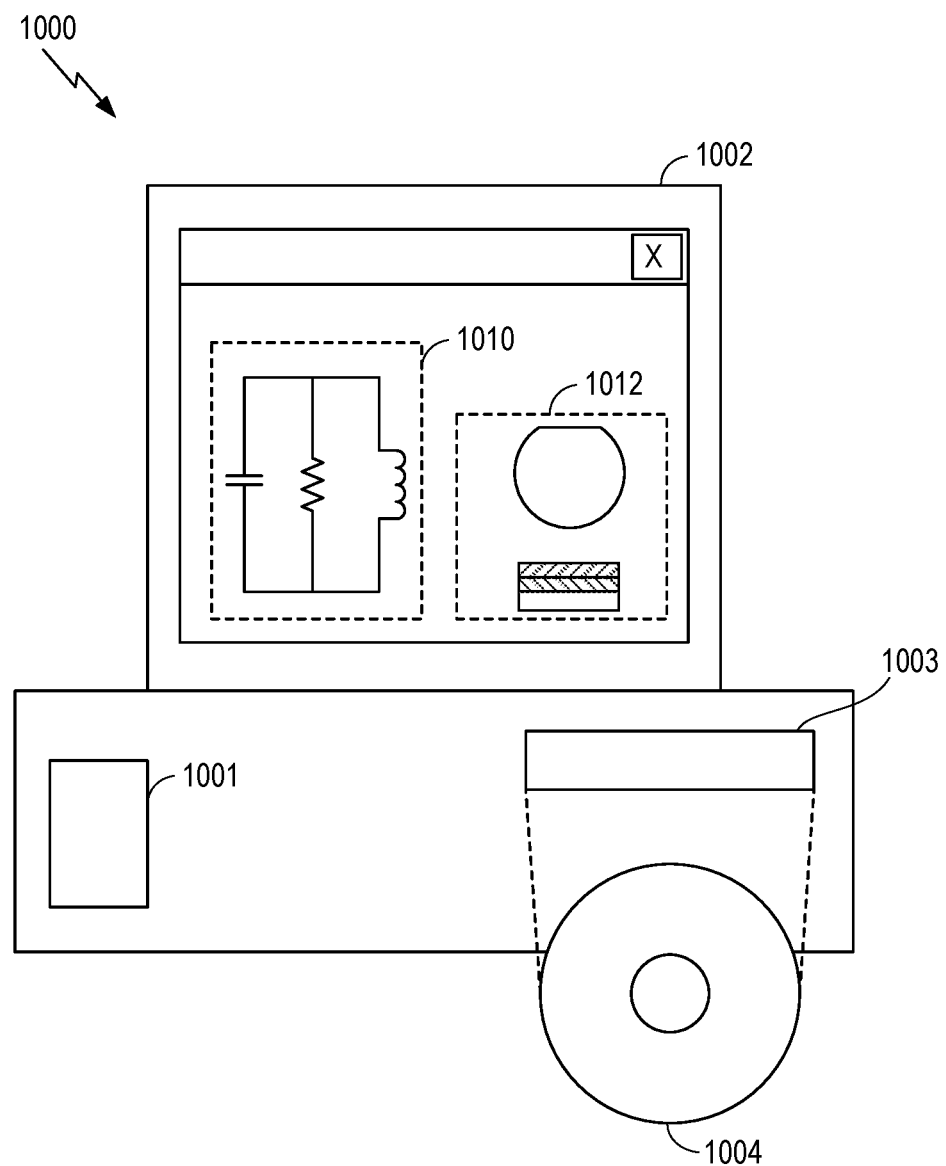
FIG. 10 is a block diagram illustrating a design workstation used for circuit, layout, and logic design of a heterojunction bipolar transistor (HBT) structure according to one configuration.

FIG. 10 is a block diagram illustrating a design workstation used for circuit, layout, and logic design of an IC structure, such as the HBT device disclosed above. A design workstation 1000 includes a hard disk 1001 containing operating system software, support files, and design software such as Cadence or OrCAD. The design workstation 1000 also includes a display 1002 to facilitate a circuit design 1010 or an IC device design 1012 including the disclosed HBT device. A storage medium 1004 is provided for tangibly storing the circuit design 1010 or the IC device design 1012. The circuit design 1010 or the IC device design 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the circuit design 1010 or the IC device design 1012 including the disclosed HBT device by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to any type of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the present disclosure is provided to enable any person skilled in the art to make or use the present disclosure. Various modifications to the present disclosure will be readily apparent to those skilled in the art, and the generic principles defined herein may be applied to other variations without departing from the spirit or scope of the present disclosure. Thus, the present disclosure is not intended to be limited to the examples and designs described herein, but is to be accorded the widest scope consistent with the principles and novel features disclosed herein.

What is claimed is:

1. A heterojunction bipolar transistor (HBT) comprising:
   a base mesa and emitter mesas on a collector mesa;
   emitter contacts on the emitter mesas;
   a base contact on the base mesa;
   a first dielectric layer on the collector mesa, sidewalls of the emitter mesas, and the base contact;
   a second dielectric layer on the first dielectric layer and on sidewalls of the emitter contacts; and
   a secondary conductive layer on the first dielectric layer, the second dielectric layer, and the emitter contacts, wherein the secondary conductive layer is in contact with the first dielectric layer.

2. The HBT of claim 1, further comprising a primary conductive layer comprising the emitter contacts and the base contact.

3. The HBT of claim 2, further comprising collector contacts as part of the primary conductive layer.

4. The HBT of claim 1, in which the first dielectric layer and the second dielectric layer comprise different materials.

5. The HBT of claim 1, in which the first dielectric layer and the second dielectric layer comprise a same material.

6. The HBT of claim 1, further comprising a Gallium Arsenide (GaAs) substrate supporting the collector mesa.

7. The HBT of claim 1, integrated into a mobile phone, a set top box, a music player, a video player, an entertainment unit, a navigation device, a computer, a hand-held personal communication systems (PCS) unit, a portable data unit, and/or a fixed location data unit.

8. A radio frequency (RF) front end module, comprising:

a heterojunction bipolar transistor (HBT), comprising a base mesa and emitter mesas on a collector mesa, emitter contacts on the emitter mesas, a base contact on the base mesa, a first dielectric layer on the collector mesa, sidewalls of the emitter mesas, and the base contact, a second dielectric layer on the first dielectric layer and on sidewalls of the emitter contacts, and a secondary conductive layer on the first dielectric layer, the second dielectric layer, and the emitter contacts; and an antenna coupled to the HBT, wherein the secondary conductive layer is in contact with the first dielectric layer.

9. The RF front end module of claim 8, further comprising a primary conductive layer comprising the emitter contacts and the base contact.

10. The RF front end module of claim 9, further comprising collector contacts as part of the primary conductive layer.

11. The RF front end module of claim 8, in which the first dielectric layer and the second dielectric layer comprise different materials.

12. The RF front end module of claim 8, in which the first dielectric layer and the second dielectric layer comprise a same material.

13. The RF front end module of claim 8, further comprising a Gallium Arsenide (GaAs) substrate supporting the collector mesa.

14. The RF front end module of claim 8, integrated into a mobile phone, a set top box, a music player, a video player, an entertainment unit, a navigation device, a computer, a hand-held personal communication systems (PCS) unit, a portable data unit, and/or a fixed location data unit.

* * * * *